(12) United States Patent
Kikuchi et al.

(10) Patent No.: US 8,823,137 B2
(45) Date of Patent: Sep. 2, 2014

(54) SEMICONDUCTOR DEVICE (71) Applicant: LAPIS Semiconductor Co., Ltd., Yokohama (JP)

(72) Inventors: Hidekazu Kikuchi, Kanagawa (JP); Hisao Ohtake, Kanagawa (JP); Danya Sugai, Kanagawa (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 13/920,610

(22) Filed: Jun. 18, 2013

(65) Prior Publication Data
US 2013/0341760 A1    Dec. 26, 2013

(30) Foreign Application Priority Data

Jun. 21, 2012    (JP) .................................. 2012-139748

(51) Int. Cl.
*H01L 29/00* (2006.01)
(52) U.S. Cl.
USPC ........... 257/536; 257/537; 257/538; 438/381; 438/382; 438/383

(58) Field of Classification Search
USPC ............................ 257/536–538; 438/381–383
See application file for complete search history.

(56) References Cited

U.S. PATENT DOCUMENTS 6,369,654 B1 * 4/2002 Inagaki et al. ................ 330/293

FOREIGN PATENT DOCUMENTS

JP    H07-111311    4/1995

* cited by examiner

*Primary Examiner* — Theresa T Doan
(74) *Attorney, Agent, or Firm* — Rabin & Berdo, P.C.

(57) ABSTRACT

A semiconductor device includes first and second wells formed side by side as impurity diffusion regions of a first conductive type in a semiconductor substrate, below an intermediate dielectric film that covers a major surface of the substrate. A conductive layer formed above the intermediate dielectric film is held at a potential. A first resistive layer is formed on the intermediate dielectric film and is electrically connected to the first well. A second resistive layer is formed on the intermediate dielectric film and is electrically connected to the second well. The first resistive layer and first well form a first resistance element. The second resistive layer and second well form a second resistance element.

8 Claims, 7 Drawing Sheets

SEMICONDUCTOR DEVICE

BACKGROUND OF THE INVENTION

1. Field of the Invention

This invention relates to a semiconductor device including a resistance element as part of a semiconductor integrated circuit.

2. Description of the Related Art

Resistance elements are extensively used in semiconductor integrated circuits for voltage control purposes such as the division and reduction of power supply and signal voltages, and for various other purposes. Exemplary resistance elements are disclosed by Japanese Patent Application Publication No. H07(1995)-111311 (hereinafter "Iwai").

Figure 1:
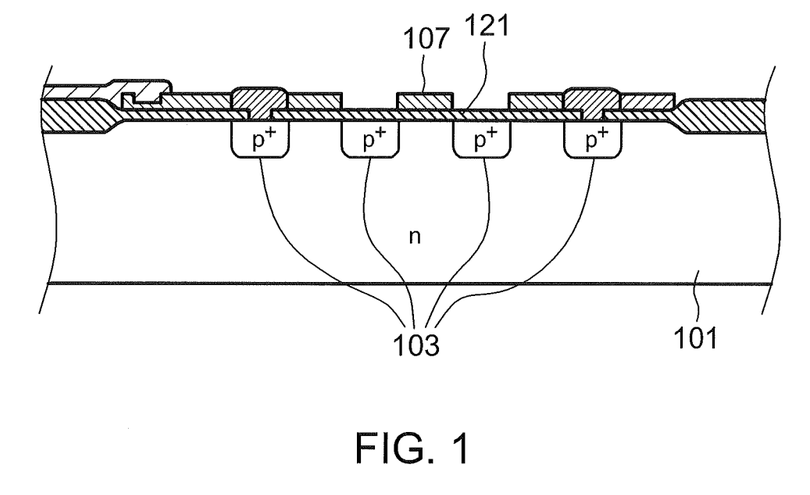
FIG. 1 is a schematic sectional view of a semiconductor device including conventional resistance elements.

The resistance elements disclosed by Iwai are illustrated in schematic cross section in FIG. 1. The resistance elements shown in FIG. 1 are formed as a plurality of p$^+$ diffused resistance regions 103 in the surface layer of an n-type silicon substrate 101. The silicon substrate 101 is covered by a thin oxide film 121. The diffused resistance regions 103 are formed by implantation of impurity ions such as boron ions into the silicon substrate 101 through the thin oxide film 121. A low-resistance polycrystalline silicon (polysilicon) layer 107 covers all parts of the oxide film 121 in the resistance element area, except the parts directly over the diffusion regions 103. The polysilicon layer 107 is held at the power supply voltage to block the effects of electric fields created by higher layers of wiring (not shown) and prevent the formation of p-type inversion layers in the substrate areas directly below the polysilicon layer 107, so that no current can leak between adjacent diffused resistance regions 103.

Recently, however, increasingly precise voltage control is being required in analog integrated circuits, creating a strong need to stabilize the characteristics of resistance elements by reducing variations in resistance value between resistance elements in the same circuit. When the resistance elements are formed as taught by Iwai, their electrical characteristics are affected by variations in the substrate potential and, because of the thinness of the oxide film 121 and consequent proximity of the diffusion regions 103 to the polysilicon layer 107, by variations in the power supply voltage applied to the polysilicon layer 107.

SUMMARY OF THE INVENTION

An object of the present invention is to provide a semiconductor device with more stable resistance characteristics.

The invention provides a semiconductor device that includes a plurality of resistance elements on and in a semiconductor substrate having a major surface. The semiconductor device includes first and second wells formed as impurity diffusion regions of a first conductive type in the semiconductor substrate. The second well is separated from the first well in a direction parallel to a major surface of the semiconductor substrate. An intermediate dielectric film covers the major surface of the semiconductor substrate. A conductive layer is formed above a semiconductor region in the semiconductor substrate between the first and second wells and is held at a potential. The intermediate dielectric film intervenes between the conductive layer and the semiconductor region.

A first resistive layer is formed on the intermediate dielectric film and is electrically connected to the first well. A second resistive layer is formed on the intermediate dielectric film and is electrically connected to the second well. The first resistive layer and first well form a first resistance element that is one of the resistance elements. The second resistive layer and second well form a second resistance element that is another one of the resistance elements.

The conductive layer can be held at the potential that prevents the formation of an inversion layer of the first conductive type in the semiconductor region between the first and second wells, thereby preventing the leakage of current between the wells. The intermediate dielectric layer prevents current leakage between the resistive layers, and stabilizes the electrical characteristics of the resistance elements by distancing the conductive layer from the wells and the resistive layers from the semiconductor substrate.

DETAILED DESCRIPTION OF THE INVENTION

An embodiment of the invention will now be described with reference to the attached drawings, in which like elements are indicated by like reference characters.

Figure 2:
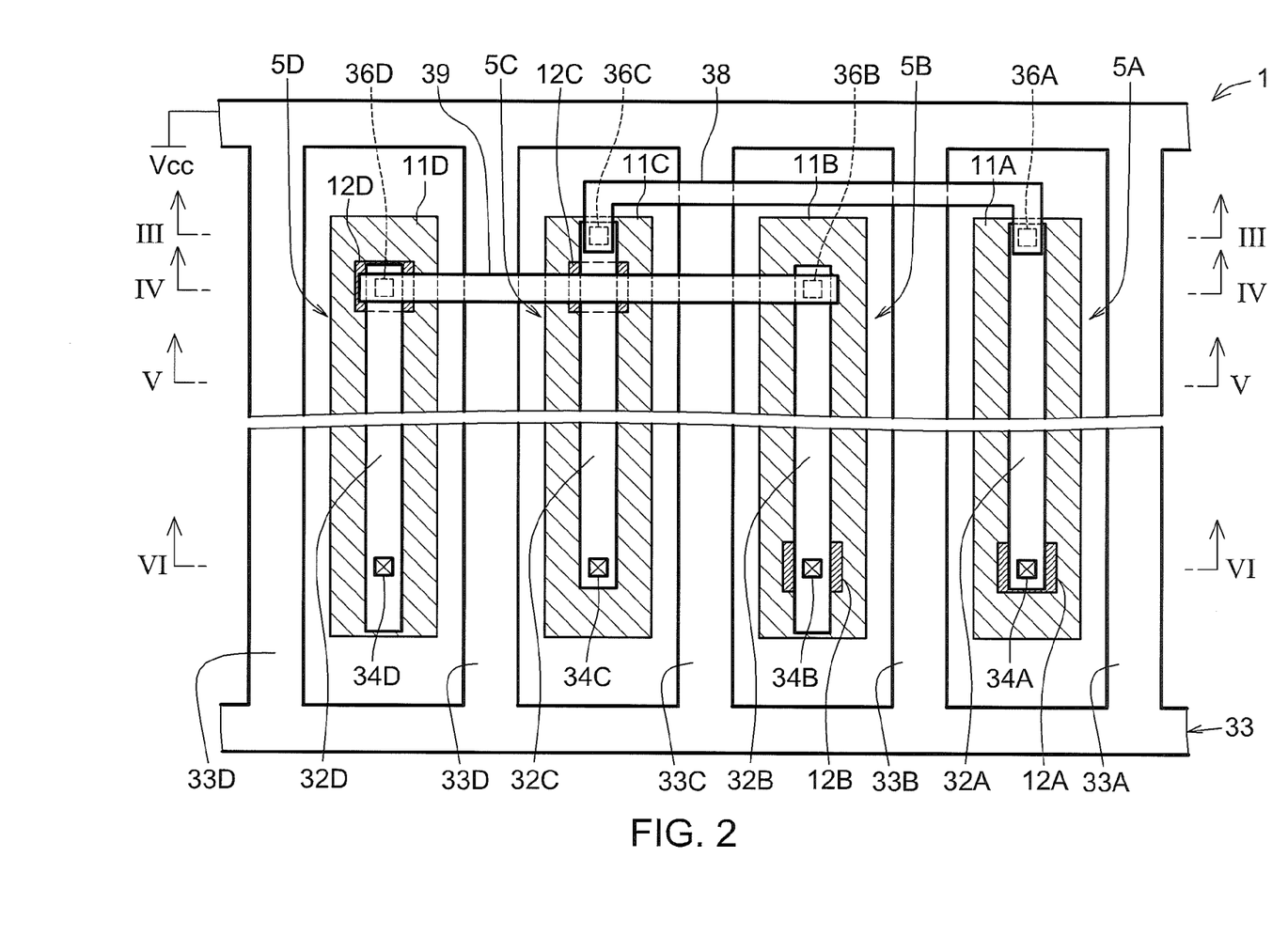
FIG. 2 is a schematic top plan view showing part of the layout of a novel semiconductor integrated circuit.

The embodiment is a semiconductor device with a layout shown partially in FIG. 2. The semiconductor device 1 includes a plurality of semiconductor elements such as resistance elements, metal-oxide-semiconductor (MOS) transistors, capacitors, and so on. FIG. 2 shows the layout of four resistance elements 5A, 5B, 5C, 5D. FIGS. 3 to 6 show cross sections through lines III-III, IV-IV, V-V, and VI-VI, respectively, in FIG. 2. The dielectric layers 20, 21, 22, 23 shown in FIGS. 3 to 6 are omitted from FIG. 2.

As shown in FIG. 2, the semiconductor device 1 includes p-type impurity diffusion regions or wells 11A, 11B, 11C, 11D disposed in parallel, resistive layers 32A, 32B, 32C, 32D formed above the wells 11A, 11B, 11C, and 11D, and a conductive layer referred to below as a conductive wiring layer 33. As viewed from the top, the conductive wiring layer 33 surrounds each of the wells 11A, 11B, 11C, and 11D. The conductive wiring layer 33 is held at a fixed power supply voltage Vcc. Resistive layers 32A and 32C are electrically interconnected via a first interconnection wire 38. Resistive layers 32B and 32D are electrically interconnected via a second interconnection wire 39. The resistive layers 32A, 32B, 32C, 32D may be made from, for example, a polycrystalline silicon material. The conductive wiring layer 33, first interconnection wire 38, and second interconnection wire 39 may be made from, for example, patterned layers of a metal material such as aluminum or copper.

The wells 11A, 11B, 11C, 11D and resistive layers 32A, 32B, 32C, 32D constitute respective resistance elements 5A, 5B, 5C, 5D.

As shown in FIGS. 3 to 6, the wells 11A, 11B, 11C, 11D are formed in the upper surface (major surface) of an n-type monocrystalline silicon semiconductor substrate 10. The wells 11A to 11D can be created by forming a resist pattern (not shown) on the upper surface of the semiconductor substrate 10, using this resist pattern as a mask to selectively implant boron ions, boron fluoride ions, or another suitable p-type impurity, and activating the implanted ions by heat treatment. The wells 11A to 11D are mutually separated in a direction (the horizontal direction in FIGS. 3 to 6) parallel to the major surface of the semiconductor substrate 10.

This embodiment uses an n-type monocrystalline silicon semiconductor substrate 10, but other types of substrates may be used. The n-type monocrystalline silicon substrate may be replaced with a semiconductor substrate with an n-type epitaxial layer, or by a semiconductor-on-insulator or silicon-on-insulator (SOI) substrate. An SOI substrate includes a base layer, a semiconductor surface layer, and a buried dielectric film interposed between the base layer and the semiconductor surface layer. The buried dielectric film electrically isolates the semiconductor surface layer from the base layer.

The upper surface of the semiconductor substrate 10 is covered with an element isolation dielectric film 20. The element isolation dielectric film 20 electrically isolates the plurality of semiconductor elements in the horizontal direction. The element isolation dielectric film 20 may be a field dielectric film 0.1 micrometer to several micrometers thick formed by a local oxidization of silicon (LOCOS) process. Alternatively, the element isolation dielectric film 20 may be formed by a shallow trench isolation (STI) process or other known trench isolation process. The thickness of the element isolation dielectric film 20 in this embodiment is greater than the thickness of the gate oxide film or other surface oxide film that is generally formed on the upper surface of the semiconductor substrate. The resistive layers 32A to 32D have comparatively high resistivity (sheet resistance). Being formed above the element isolation dielectric film 20, resistive layers 32A to 32D are comparatively unaffected by the electrical potential of the semiconductor substrate 10.

A lower dielectric film 21 such as a silicon dioxide film is formed on the element isolation dielectric film 20. In this embodiment the element isolation dielectric film 20 and lower dielectric film 21 constitute the intermediate dielectric film. The resistive layers 32A, 32B, 32C, 32D are formed on the lower dielectric film 21 and extend parallel to the wells 11A, 11B, 11C, 11D. After deposition of the lower dielectric film 21, the resistive layers 32A to 32D are formed by forming a polysilicon layer doped with phosphorus or another impurity on the lower dielectric film 21, and then patterning the polycrystalline silicon layer by photolithography and anisotropic etching.

Figure 6:
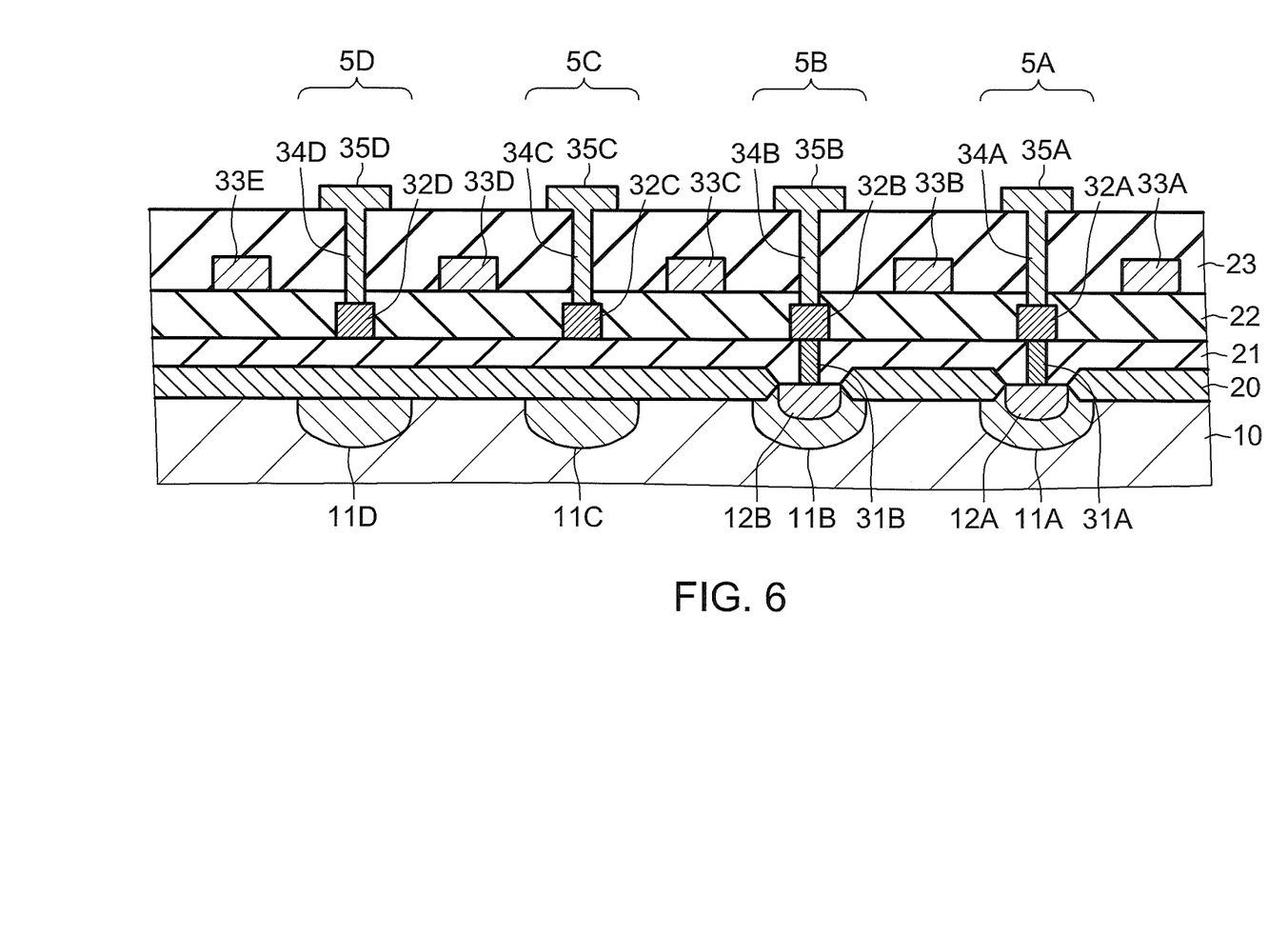
FIG. 6 is a schematic sectional view through line VI-VI in FIG. 2.

As shown in FIG. 6, a p+ well contact region 12A, which is a p-type region in which the p-type impurity is diffused with a higher concentration than in the well 11A, is formed within the well 11A below the resistive layer 32A. The resistive layer 32A is electrically connected with the well 11A through the well contact region 12A and a contact plug 31A embedded in the lower dielectric film 21. Similarly, a p+ well contact region 12B having a higher impurity concentration than the well 11B is formed within the well 11B below the resistive layer 32B, and the resistive layer 32B is electrically connected with the well 11B through a well contact region 12B and a contact plug 31B embedded in the lower dielectric film 21.

Figure 4:
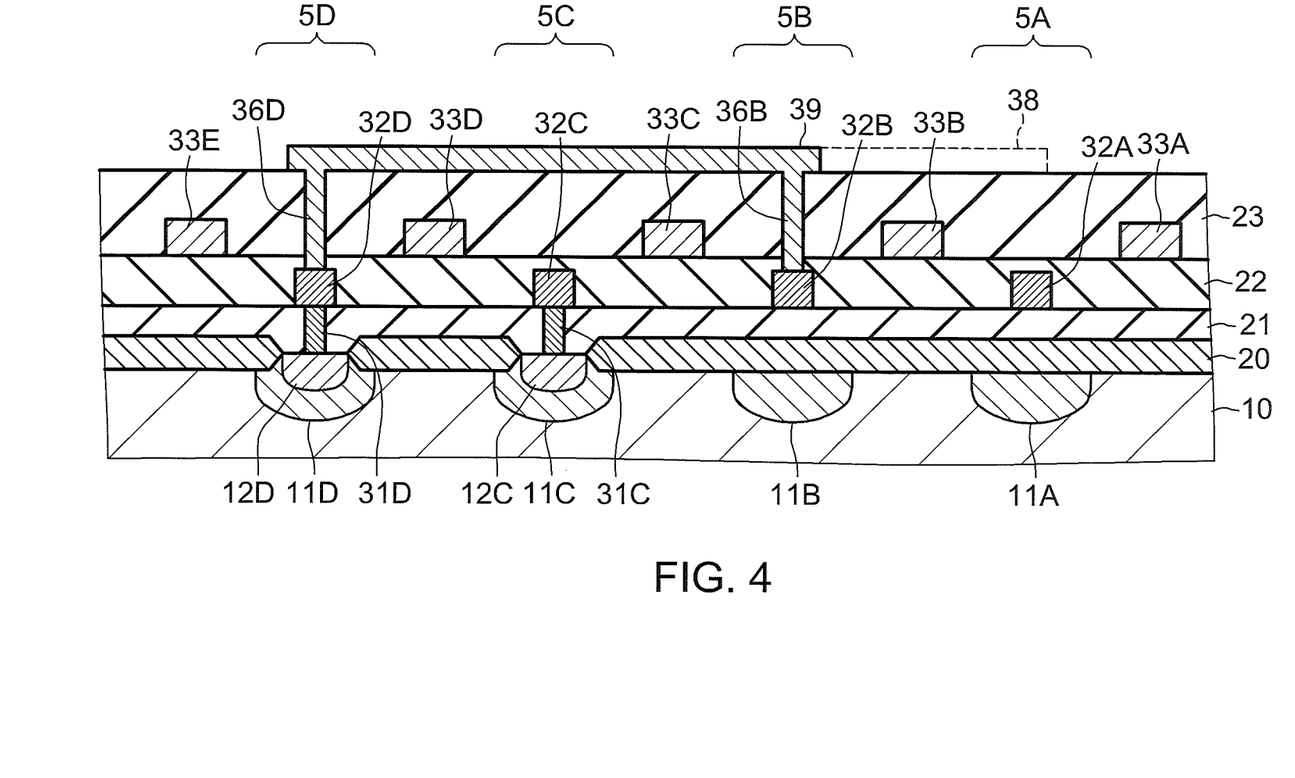
FIG. 4 is a schematic sectional view through line IV-IV in FIG. 2.

As shown in FIG. 4, a p+ well contact region 12C, which is a p-type region in which the p-type impurity is diffused with a higher concentration than in the well 11C, is formed within the well 11C below the resistive layer 32C. The resistive layer 32C is electrically connected with the well 11C through a well contact region 12C and a contact plug 31C embedded in the lower dielectric film 21. Similarly, a p+ well contact region 12D having a higher impurity concentration than the well 11D is formed within the well 11D below the resistive layer 32D, and the resistive layer 32D is electrically connected with the well 11D through a well contact region 12D and a contact plug 31D embedded in the lower dielectric film 21.

The contact plugs 31A, 31B, 31C, 31D can be formed by, for example, forming contact holes in the lower dielectric film 21 by photolithography and etching, thereby exposing the upper surface of the semiconductor substrate 10, and filling an electrically conductive material into these contact holes by chemical vapor deposition (CVD).

As shown in FIGS. 3 to 6, a first interlayer dielectric film 22 is formed on the lower dielectric film 21, covering the resistive layers 32A to 32D. A second interlayer dielectric film 23 is formed on the first interlayer dielectric film 22. The first interlayer dielectric film 22 and second interlayer dielectric film 23 can be formed in the same way as the lower dielectric film 21 by using CVD to deposit a dielectric material with a thickness of from 0.1 micrometer to several tens of micrometers.

Figure 5:
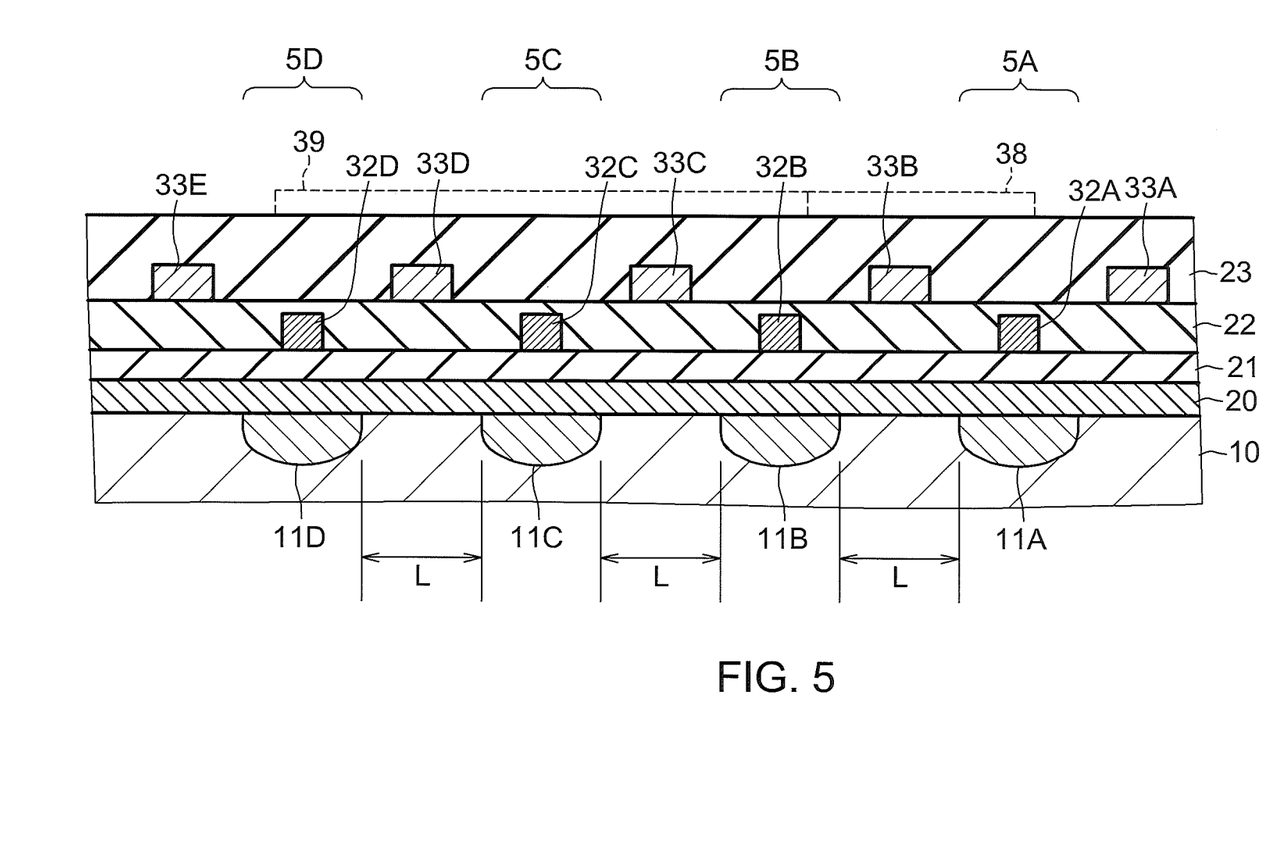
FIG. 5 is a schematic sectional view through line V-V in FIG. 2.

As shown in FIGS. 4 to 6, the conductive wiring layer 33 includes conductive layers 33A, 33B, 33C, 33D, 33E that extend on the first interlayer dielectric film 22 in the same direction as the wells 11A to 11D. The conductive layer 33B is disposed above the n-type region between mutually adjacent wells 11A and 11B. This structure creates a parasitic p-channel transistor having the conductive layer 33B as its gate electrode, the dielectric films below the conductive layer 33B as its gate insulation film, and the mutually adjacent p-type wells 11A and 11B as its source and drain. The power supply voltage Vcc applied to the conductive layer 33B is adjusted to a voltage value that does not allow this parasitic transistor to turn on; that is, it does not allow the formation of an n-type inversion layer in the region between the wells 11A and 11B. This prevents current from leaking between the wells 11A and 11B when the semiconductor device 1 is powered on. A similar conductive layer 33C is disposed above the n-type region between mutually adjacent wells 11B and 11C, and another similar conductive layer 33D is disposed above the n-type region between mutually adjacent p-type wells 11C and 11D.

The wells 11A, 11B, 11C, 11D act to shield the resistive layers 32A, 32B, 32C, 32D from variations in the substrate potential. To stabilize the potentials of the wells 11A, 11B, 11C, 11D, their horizontal dimensions should be greater than the horizontal dimensions of the resistive layers 32A, 32B, 32C, 32D. The greater dimensions of the wells 11A, 11B, 11C, 11D shorten the width L (FIG. 5) of the spacing between them, and the width of the conductive layers 33B, 33C, 33D is still shorter, but the thick dielectric layer consisting of the element isolation dielectric film 20, lower dielectric film 21, and first interlayer dielectric film 22 that intervenes between the semiconductor substrate 10 and the conductive layers 33B, 33C, 33D enables the conductive layers 33B, 33C, 33D to counteract electric fields generated by higher-level wiring (not shown) and therefore prevent the parasitic transistors from turning on despite the shortness of dimension L. Current leakage is accordingly reliably prevented.

Figure 3:
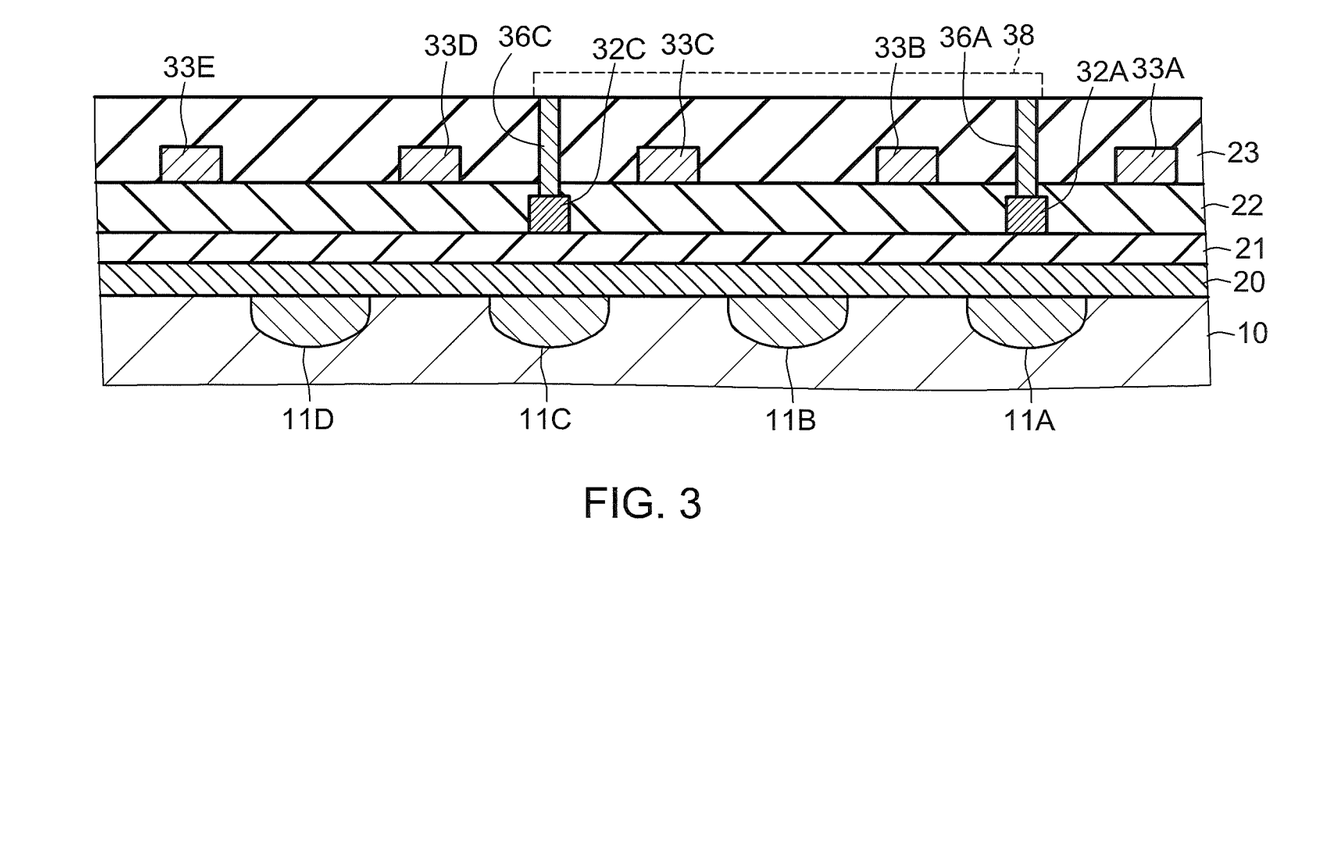
FIG. 3 is a schematic sectional view through line III-III in FIG. 2.

As shown in FIGS. 2 and 3, the first interconnection wire 38 that electrically interconnects resistive layers 32A and 32C is formed on the second interlayer dielectric film 23. Upper contact plugs 36A and 36C electrically interconnected with the upper surfaces of resistive layers 32A and 32C are embedded in the first interlayer dielectric film 22 and second interlayer dielectric film 23. The first interconnection wire 38 electrically interconnects resistive layers 32A and 32C via these upper contact plugs 36A, 36C. As shown in FIGS. 2 and 4, the second interconnection wire 39 that electrically interconnects resistive layers 32B and 32D is likewise formed on the second interlayer dielectric film 23. Upper contact plugs 36B and 36D electrically interconnected with the upper surfaces of resistive layers 32B and 32D are embedded in the first interlayer dielectric film 22 and second interlayer dielectric film 23. The second interconnection wire 39 electrically interconnects resistive layers 32B and 32D via the upper contact plugs 36B and 36D.

The upper contact plugs 36A, 36B, 36C, 36D can be formed by creating contact holes in the first interlayer dielectric film 22 and second interlayer dielectric film 23 by photolithography and etching to expose the upper surfaces of the resistive layers 32A to 32D, for example, and filling the contact holes with an electrically conductive material by CVD.

As shown in FIG. 6, the resistive layers 32A, 32B, 32C, 32D are electrically connected with upper wiring layers 35A, 35B, 35C, 35D through upper contact plugs 34A, 34B, 34C, 34D, respectively. These upper contact plugs 34A to 34D are formed at the same time and by the same process as the upper contact plugs 36A, 36B, 36C, 36D shown in FIGS. 3 and 4. The upper wiring layers 35A, 35B, 35C, 35D are not shown in FIG. 2.

Figure 7:
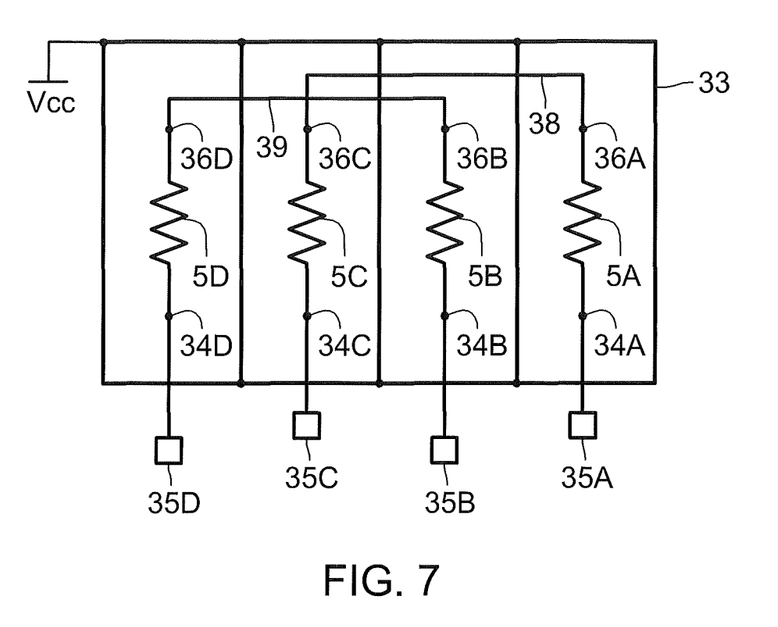
FIG. 7 is an equivalent circuit diagram of the resistance elements shown in FIG. 2.

The four resistance elements 5A, 5B, 5C, 5D in FIG. 2 function as components of an integrated circuit in the semiconductor device 1. FIG. 7 shows an equivalent circuit including the four resistance elements 5A, 5B, 5C, 5D. The first resistance element 5A includes the resistive layer 32A, the well 11A, and the contact plug 31A. The second resistance element 5B includes the resistive layer 32B, the well 11B, and the contact plug 31B. The third resistance element 5C includes the resistive layer 32C, the well 11C, and the contact plug 31C. The fourth resistance element 5D includes the resistive layer 32D, the well 11D, and the contact plug 31D.

Resistance elements 5A and 5C are interconnected in series via the first interconnection wire 38 to form a single resistor, and resistance elements 5B and 5D are interconnected in series via the second interconnection wire 39 to form another single resistor. By interconnecting the resistance elements in this way so that the geometric centers of both interconnected pairs of resistance elements are close together, possible variations in the characteristics of the two resistors due to lateral variations in manufacturing process conditions can be reduced.

As described above, the semiconductor device 1 in the first embodiment includes a conductive layer 33B formed above the region between mutually adjacent wells 11A and 11B, a conductive layer 33C formed above the region between mutually adjacent wells 11B and 11C, and a conductive layer 33D formed above the region between the mutually adjacent wells 11C and 11D, and applies a power supply voltage Vcc to the conductive layers 33B, 33C, 33D such that the parasitic transistors in these regions cannot turn on. Accordingly, despite electrical fields generated by wiring (not shown) above the regions between the mutually adjacent wells 11A, 11B, 11C, 11D during the operation of the semiconductor device 1, occurrence of current leakage by transition of parasitic transistors to the on state is reliably prevented.

Since current leakage through parasitic transistors is reliably prevented, it is possible to increase the horizontal dimensions of the wells 11A, 11B, 11C, 11D to stabilize their electrical potentials, and thereby shield the resistive layers 32A, 32B, 32C, 32D from the effects of substrate potential variations. The effects of variations in the power supply voltage Vcc applied to the conductive layers 33B, 33C, 33D are mitigated by the distance of these conductive layers from the wells 11A, 11B, 11C, 11D and resistive layers 32A, 32B, 32C, 32D. Accordingly, unwanted variations in the characteristics of the resistance elements 5A to 5C and unwanted current leakage can both be prevented.

For example, even if the resistance elements 5A to 5D are used for controlling (dividing, reducing, etc.) a comparatively high voltage on the order of several tens of volts in the semiconductor device 1, a proper balance can be achieved between current leakage prevention and stabilization of resistance characteristics.

Although the interconnections among the plurality of resistance elements 5A to 5D shown in FIGS. 2 to 7, by means of which alternately disposed resistance elements 5A and 5C constitute a first resistor and alternately disposed resistance elements 5B and 5D constitute a second resistor, reduce variations in electrical characteristics between the first and second resistors, the voltages applied to upper wiring layers 35B and 35D in FIG. 6 and thus to the second interconnection wire 39 in FIG. 4 generate an electric field above the regions between wells 11C and 11D and between wells 11C and 11B. As noted above, however, the fixed Vcc potentials of conductive layers 33C and 33D prevent the formation of inversion layers in the regions between the wells 11C and 11D and between wells 11C and 11B, thereby preventing current leakage between the first and second resistors.

An embodiment of the invention has been described with reference to the exemplary drawings, but those skilled in the art will appreciate that various other embodiments are possible. For example, the element isolation dielectric film 20 may be formed by a process other than the LOCOS and trench isolation processes mentioned above.

Another possible variation of the above embodiment is a semiconductor device in which the conductivity types are reversed so that the wells 11A to 11D are n-type and the regions between them are p-type.

Those skilled in the art will recognize that further variations are possible within the scope of the invention, which is defined+ in the appended claims.

What is claimed is:

1. A semiconductor device including a plurality of resistance elements on and in a semiconductor substrate having a major surface, the semiconductor device comprising:

a first well formed as an impurity diffusion region of a first conductive type in the semiconductor substrate;

a second well formed as an impurity diffusion region of the first conductive type in the semiconductor substrate, separated from the first well in a direction parallel to the major surface of the semiconductor substrate;

an intermediate dielectric film covering the major surface of the semiconductor substrate;

a conductive layer held at a predetermined potential and formed above a semiconductor region in the semiconductor substrate between the first well and the second well;

a first resistive layer formed on the intermediate dielectric film and electrically connected to the first well; and a second resistive layer formed on the intermediate dielectric film and electrically connected to the second well; wherein the first resistive layer and the first well form a first resistance element that is one of the resistance elements;

the second resistive layer and the second well form a second resistance element that is another one of the resistance elements; and the intermediate dielectric film intervenes between the conductive layer and the semiconductor region.

2. The semiconductor device of claim 1, further comprising an interlayer dielectric film that intervenes between the intermediate dielectric film and the conductive layer.

3. The semiconductor device of claim 1, wherein:
the intermediate dielectric film includes an element isolation dielectric film formed on the major surface of the semiconductor substrate; and
the first and second resistive layers are formed above the element isolation dielectric film.

4. The semiconductor device of claim 3, wherein the element isolation dielectric film is a field dielectric film formed by a local oxidization of silicon process.

5. The semiconductor device of claim 1, wherein the first well and the second well are horizontally separated by an interval shorter than an interval horizontally separating the first resistive layer from the second resistive layer.

6. The semiconductor device of claim 3, wherein:
the first well is wider than the first resistive layer in said direction parallel to the major surface; and
the second well is wider than the second resistive layer in said direction parallel to the major surface.

7. The semiconductor device of claim 1, further comprising:
a third well formed as an impurity diffusion region of the first conductive type in the semiconductor device, separated from the first well in said direction parallel to the major surface;
a third resistive layer formed on the intermediate dielectric film and electrically connected to the third well; and
a first upper wire electrically interconnecting the first resistive layer and the third resistive layer; wherein
the third resistive layer and the third well constitute a third resistance element;
the third resistance element is electrically connected in series with the first resistance element; and
the second well is disposed between the first well and the third well.

8. The semiconductor device of claim 7, further comprising:
a fourth well formed in the semiconductor substrate as an impurity diffusion region of the first conductive type, separated from the second well in said direction parallel to the major surface;
a fourth resistive layer formed on the intermediate dielectric film and electrically connected with the fourth well; and
a second upper wire electrically interconnecting the second resistive layer and the fourth resistive layer; wherein
the fourth resistive layer and the fourth well constitute a fourth resistance element;
the fourth resistance element is electrically connected in series with the second resistance element; and
the third well is disposed between the second well and the fourth well.

* * * * *